US006684132B2

(12) United States Patent
Wakui et al.

(10) Patent No.: US 6,684,132 B2
(45) Date of Patent: Jan. 27, 2004

(54) ACTIVE ANTI-VIBRATION APPARATUS AND EXPOSURE APPARATUS

(75) Inventors: Shinji Wakui, Tochigi (JP); Isao Iwai, Saitama (JP); Takashi Maeda, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 244 days.

(21) Appl. No.: 09/777,955

(22) Filed: Feb. 7, 2001

(65) Prior Publication Data

US 2001/0011697 A1 Aug. 9, 2001

(30) Foreign Application Priority Data

Feb. 9, 2000 (JP) ........................................ 2000-031342

(51) Int. Cl.[7] ........................... F16F 15/02; G05D 19/00
(52) U.S. Cl. ........................ 700/280; 248/550; 318/651
(58) Field of Search .............................. 700/280, 56–61, 700/275, 302; 248/550, 638; 318/651

(56) References Cited

U.S. PATENT DOCUMENTS

| 5,511,930 | A | | 4/1996 | Sato et al. ................... 414/676 |
|---|---|---|---|---|
| 5,568,032 | A | | 10/1996 | Wakui ......................... 318/632 |
| 5,653,317 | A | | 8/1997 | Wakui ......................... 188/378 |
| 5,812,420 | A | | 9/1998 | Takahashi ................... 364/508 |
| 5,900,707 | A | | 5/1999 | Wakui ......................... 318/625 |
| 6,128,522 | A | | 10/2000 | Acker et al. ................. 600/411 |
| 6,128,552 | A | * | 10/2000 | Iwai et al. ................... 700/280 |
| 6,170,622 | B1 | | 1/2001 | Wakui et al. ................ 188/378 |

FOREIGN PATENT DOCUMENTS

| JP | 9-134876 | 5/1997 |
|---|---|---|
| JP | 9-326362 | 12/1997 |
| JP | 10-103403 | 4/1998 |
| JP | 10-141428 | 5/1998 |
| JP | 10-256141 | 9/1998 |
| JP | 10-261561 | 9/1998 |
| JP | 10-311364 | 11/1998 |
| JP | 11-264444 | 9/1999 |
| JP | 11-327657 | 11/1999 |

OTHER PUBLICATIONS

Patent Abstracts of Japan, vol. 1998, No. 04, Mar. 31, 1998 (JP 09–326362, Dec. 16, 1997).

* cited by examiner

*Primary Examiner*—Leo Picard
*Assistant Examiner*—Walter Russell Swindell
(74) *Attorney, Agent, or Firm*—Fitzpatrick, Cella, Harper & Scinto

(57) ABSTRACT

This invention relates to an active anti-vibration apparatus having an anti-vibration table on which a stage is mounted. This anti-vibration apparatus includes a pneumatic spring actuator for supporting and driving the anti-vibration table, a PI compensator for PI-compensating a target velocity signal determined by a velocity profile concerning the stage and necessary for driving the stage, and a motion mode distributing operation unit for controlling the pneumatic spring actuator in accordance with an output signal from the PI compensator.

12 Claims, 9 Drawing Sheets

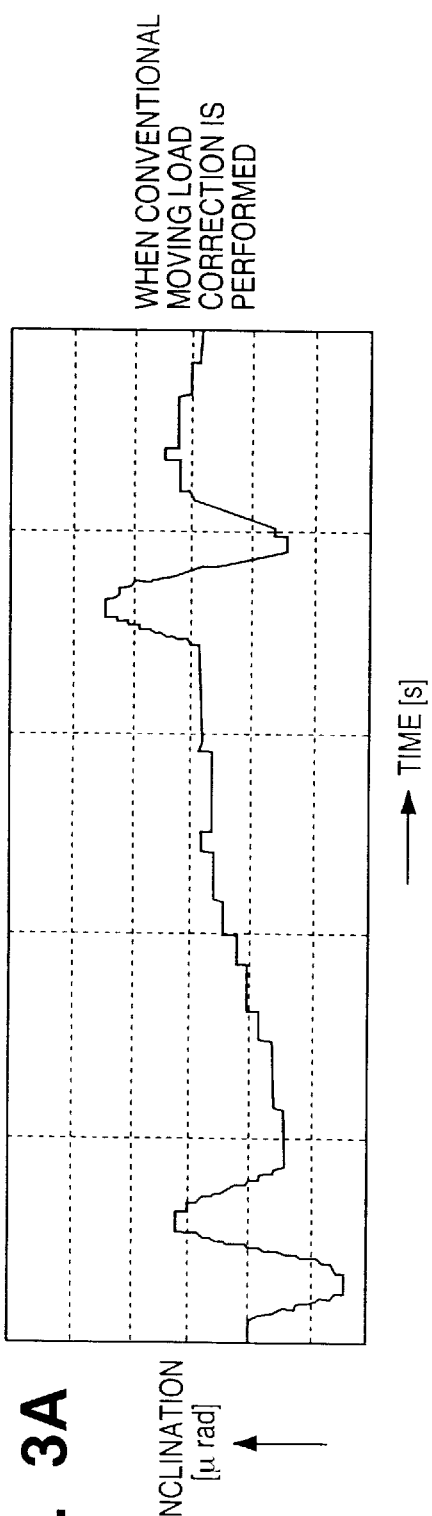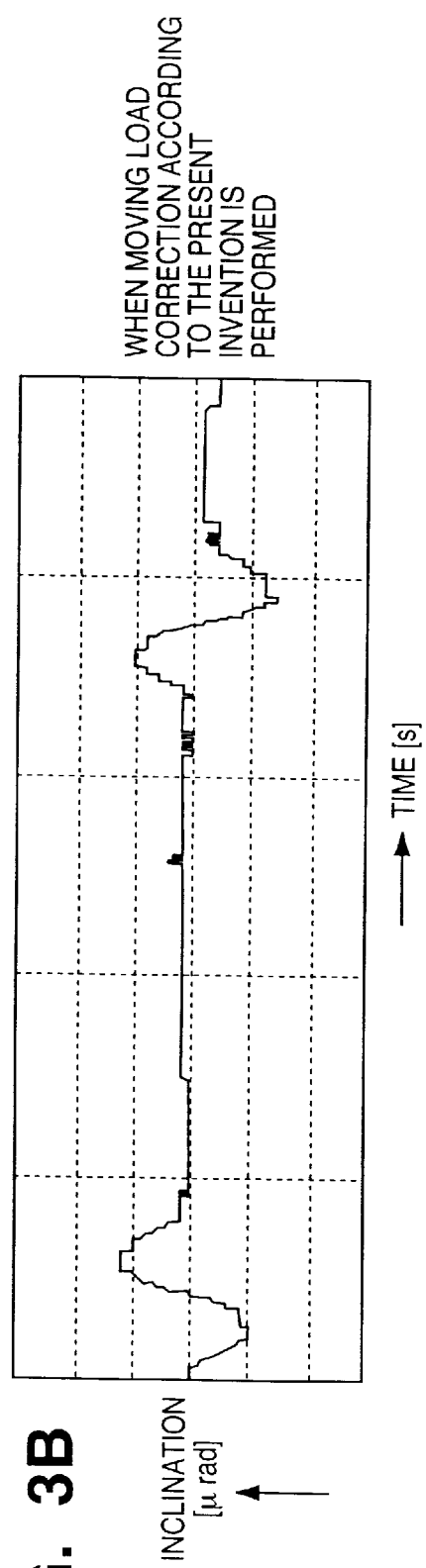
F I G. 3A  When conventional moving load correction is performed
F I G. 3B  When moving load correction according to the present invention is performed

ACCELERATION / TIME

VELOCITY / TIME

POSITION / TIME

ACTIVE ANTI-VIBRATION APPARATUS AND EXPOSURE APPARATUS

CROSS-REFERENCE TO RELATED APPLICATIONS

This application is related to U.S. application Ser. No. 09/035,982 entitled "Anti-vibration apparatus and anti-vibration method thereof" filed on Mar. 6, 1998 and issued as U.S. Pat. No. 6,170,622 on Jan. 9, 2001 naming Shinji Wakui, Takehiko Mayama and Hiroaki Kato as inventors and assigned to the assignee of this application.

FIELD OF THE INVENTION

The present invention relates to an active anti-vibration apparatus suitably used in a semiconductor manufacturing exposure apparatus or electron microscope which prints a pattern on a reticle onto a semiconductor wafer, or a liquid crystal substrate manufacturing exposure apparatus or electron microscope which prints a pattern on a reticle onto a glass substrate or the like, and an exposure apparatus using the same.

More specifically, the present invention relates to an active anti-vibration apparatus which can suppress an external vibration transmitted to an anti-vibration table and positively cancel a vibration generated by a precision machine itself mounted on the anti-vibration table, and can correct the inclination of the anti-vibration table produced by the moving load of a stage mounted on the anti-vibration table, and an exposure apparatus using this active anti-vibration apparatus.

BACKGROUND OF THE INVENTION

In an electron microscope using an electron beam, or an exposure apparatus represented by a stepper, a wafer stage is mounted on an anti-vibration apparatus. The anti-vibration apparatus has a function of damping vibrations by a vibration absorbing means such as a pneumatic spring, coil spring, anti-vibration rubber member, and the like.

In a passive anti-vibration apparatus with the vibration absorbing means as described above, although a vibration transmitted to it from a floor or the like can be damped to a certain degree, a vibration produced by a wafer stage itself mounted on the anti-vibration apparatus cannot effectively be damped. In other words, a reaction force produced by high-speed motion of the wafer stage itself vibrates the anti-vibration apparatus to considerably interfere with the positioning settling performance of the wafer stage.

In the passive anti-vibration apparatus, insulation (anti-vibration) of a vibration transmitted to it from the floor or the like and a vibration suppressing (vibration control) performance for a vibration generated by high-speed movement of the wafer stage itself trade off each other.

In order to solve these problems, in recent years, an active anti-vibration apparatus tends to be used. The active anti-vibration apparatus can eliminate the trade-off between anti-vibration and vibration control within a range that can be adjusted by an adjusting mechanism. Above all, when the anti-vibration apparatus adopts feed-forward control, it can realize a performance that cannot be achieved by a passive anti-vibration apparatus.

Not only in the passive anti-vibration apparatus but also in the active anti-vibration apparatus, when the wafer stage mounted on the anti-vibration table performs step and repeat or step and scan operation, the center of its gravity changes due to the movement of the wafer stage to accordingly incline the anti-vibration table. As a sufficiently long period of time elapses, this inclination is naturally corrected and the anti-vibration table is restored to the horizontal state. However, since step and repeat or step and scan operation is performed at a high speed, the position restoring movement of the anti-vibration table cannot catch up with the wafer stage, and the anti-vibration table is consequently inclined.

Although this inclination is a natural physical phenomenon, it incurs a serious disadvantage to an exposure apparatus such as a semiconductor exposure apparatus. For example, a functional unit provided to the main body structure vibrates undesirably due to the inclination of the main body structure, so a predetermined performance cannot be obtained. As a countermeasure for this, a response to the disturbance may be suppressed by increasing the eigenfrequency of the anti-vibration table, i.e., by making the anti-vibration table solid. In this case, however, a vibration of the floor or the like becomes easily transmitted to the anti-vibration table, leading to degradation in anti-vibration characteristics. A technique for correcting the inclination of the main body structure without impairing the anti-vibration characteristics is therefore sought for.

For the sake of further detailed understanding, the above contents will be described with reference to the mechanical arrangement of an active anti-vibration apparatus in which a wafer stage is mounted on an anti-vibration table. FIG. 2 is a perspective view showing an example of the mechanical arrangement of the active anti-vibration apparatus. In FIG. 2, a wafer stage 21 is mounted on an anti-vibration table 22, and active support legs 23-1, 23-2, and 23-3 support the anti-vibration table 22. Each active support leg 23 (23-1, 23-2, or 23-3) incorporates acceleration sensors AC-xx, position sensors PO-xx, pressure sensors PR-xx, servo valves SV-xx, and pneumatic spring actuators AS-xx necessary for controlling the motion in the two axes, i.e., the vertical and horizontal axes. Suffixes xx attached to AC, PO, and the like indicate the directions in the coordinate system in FIG. 2 and the positions of the active support legs 23. For example, Y2 denotes a component incorporated in the active support leg 23-2 located in the Y direction and on the left side.

A phenomenon wherein the Y stage of the wafer stage 21 has moved for a certain distance in the Y direction shown in FIG. 2 and stopped. The movement of the Y stage in the Y direction corresponds to a change in center of gravity of the entire anti-vibration table for the active support leg 23. A thrust which is necessary for maintaining the horizontal posture of the anti-vibration table 22 regardless of the change in center of gravity and should be generated by a vertical actuator in each active support leg 23 is uniquely determined. When the Y stage moves and is set in a steady state, after a lapse of a sufficiently long period of time, because of position control, the active support leg 23 generates a thrust that matches the change in center of gravity, and the anti-vibration table 22 is restored to the horizontal state.

The situation changes when the Y stage continuously performs step and repeat or step and scan operation. As the Y stage moves continuously, the position of the center of gravity also changes continuously. Thus, the active support legs 23 cannot be returned to the preset positions in time, and the anti-vibration table 22 inclines gradually. When the X stage performs step and repeat or step and scan operation, it generates rotation (inclination) about the Y-axis due to the same reason. The inclination of the anti-vibration table 22 degrades the measuring precision of a measuring unit (not shown) or the positioning settling performance of the stage itself, partly impairing the productivity of the semiconductor exposure apparatus. Therefore, a technique for correcting the inclination of the anti-vibration table which is caused by a change in center of gravity upon movement of the stage has been sought for.

In order to solve the above problem, Japanese Patent Laid-Open No. 9-134876 (Anti-Vibration Apparatus and Exposure Apparatus) is known as a prior art. According to this reference, the inclination of an anti-vibration table caused by a change in center of gravity upon movement of a stage is predicted on the basis of an output from the position detecting means (laser interferometer) of the stage, and a feed-forward command value for correcting this inclination is input to the vibration control system of the anti-vibration apparatus. The actuator is a voice coil motor (VCM), to which a steady current for correcting the inclination of the anti-vibration table caused upon movement of the stage is supplied. As is easily understood, drawbacks caused by supplying the steady current are as follows:

(1) The size of a VCM drive power supply becomes large.

(2) The VCM and a power amplifier for driving it generate heat.

(3) A cooling unit for recovering heat generated by the VCM and power amplifier must be provided.

(4) The size of a temperature adjusting unit for the entire semiconductor exposure apparatus becomes large.

Therefore, preferably, a DC current is not supplied to an anti-vibration, vibration-control VCM for a large main body structure such as one in a semiconductor exposure apparatus. A task that requires a large force should be dealt with by a pneumatic spring actuator which can drive a heavy weight by opening/closing a servo valve. In other words, the inclination of the anti-vibration table which is generated by load shift accompanying stage movement is preferably corrected by the pneumatic spring actuator.

Even when a pneumatic spring actuator is employed, the technical issue which arises when moving load correction is to be realized still exists. This is because the characteristics of the pneumatic spring actuator including the servo valve are approximately integral characteristics, that is, an integral of a signal that drives the servo valve is the actually generated driving force.

The present inventors have invented several techniques for correcting the moving load by driving a pneumatic spring actuator.

The first technique provides the arrangement of an apparatus which corrects the inclination of an anti-vibration tale by effectively using pressure feedback disclosed in Japanese Patent Laid-Open No. 10-256141(Active Anti-Vibration Apparatus) and on the basis of the moving position information of the stage, as disclosed in Japanese Patent Laid-Open No. 11-327657 (Active Anti-Vibration Apparatus and Exposure Apparatus).

The second technique does not require pressure feedback as a premise and is disclosed in Japanese Patent Laid-Open No. 11-264444 (Pneumatic Spring Type Anti-Vibration Apparatus). As a premise, this technique requires the driving characteristics of a pneumatic spring to be substantial integral characteristics. According to this technique, a velocity profile as a target value required when driving a moving load such as a stage mounted on an anti-vibration table is feed-forwarded to a preceding stage of a voltage-to-current converter which drives a servo valve for opening/closing the valve of a pneumatic spring actuator. A velocity profile is integrated once by the integral characteristics of the pneumatic spring actuator, and the pneumatic spring actuator generates a driving force corresponding to the position of the moving load. Thus, the inclination of the anti-vibration table is corrected.

In former Japanese Patent Laid-Open No. 11-327657, under the condition that pressure feedback is applied to the pneumatic spring actuator, the pressure is increased or decreased in accordance with a change in moving load, thereby correcting the inclination of the anti-vibration table. However, to apply pressure feedback, a pressure gauge must be indispensably mounted, and the feedback system must be adjusted strictly, leading to an increase in cost.

In latter Japanese Patent Laid-Open No. 11-264444, since pressure feedback need not be applied, moving load correction is easy, which is the characteristic feature. If the characteristics of the pneumatic spring actuator are complete integral characteristics, when a velocity signal is input to the pneumatic spring actuator, a driving force corresponding to the position can be generated. Strictly, however, the characteristics of the pneumatic spring actuator are not integral characteristics, but are pseudo-integral characteristics with a break point within a very low frequency range. Therefore, even when a velocity signal is input to the pneumatic spring actuator with such characteristics, a driving force strictly corresponding to the position of the moving load cannot be generated.

When actually compared to a case without a feed-forward input for moving load correction, with the technique disclosed in Japanese Patent Laid-Open No. 11-264444, the inclination of the anti-vibration table with respect to the moving load remains yet although it can be corrected to a certain degree.

The present invention provides moving load correction which does not require application of pressure feedback as a premise. More specifically, the present invention is to provide an active anti-vibration apparatus in which the effect of correction is improved over the effect of moving load correction achieved by the technique disclosed in Japanese Patent Laid-Open No. 11-264444.

SUMMARY OF THE INVENTION

The present invention has been made in view of the above situation, and has as its object to effectively suppress the inclination of an anti-vibration table which occurs when a stage is driven.

The first aspect of the present invention relates to an active anti-vibration apparatus having an anti-vibration table on which a stage is mounted. This anti-vibration apparatus comprises an actuator which supports and drives the anti-vibration table utilizing a fluid, a compensator which generates a signal by PI- or PID-compensating a target value signal concerning the stage and necessary for driving the stage, or a signal equivalent thereto, and a controller which controls the actuator in accordance with an output signal from the compensator. For example, the target value signal (e.g., a target velocity signal) is determined by a profile (e.g., a velocity profile) generated by a profiler.

According to a preferred aspect of the present invention, the compensator can include a PI compensator which PI-compensates a target velocity signal concerning the stage and necessary for driving the stage.

According to another preferred aspect of the present invention, the compensator can include a first P compensator which P-compensates a target velocity signal concerning the stage and necessary for driving the stage, a second P compensator which P-compensates a target position signal concerning the stage and necessary for driving the stage, and an adder which adds output signals from the first and second compensators.

According to still another preferred aspect of the present invention, the compensator can include a PID compensator which PID-compensates a target velocity signal concerning the stage and necessary for driving the stage. Alternatively, the compensator can include a first P compensator which P-compensates a target velocity signal concerning the stage and necessary for driving the stage, a second P compensator which P-compensates a target position signal concerning the stage and necessary for driving the stage, a third P compensator which P-compensates a target acceleration signal concerning the stage and necessary for driving the stage, and an adder which adds output signals from the first, second, and third compensators.

According to still another preferred aspect of the present invention, the actuator includes a pneumatic spring actuator.

According to the first aspect of the present invention, the inclination of the anti-vibration table which occurs when the stage is driven is corrected effectively.

According to the second aspect, the present invention relates to a method of correcting inclination of an anti-vibration table on which a stage is mounted. This method includes the compensating step of generating a signal by PI- or PID-compensating a target value signal concerning the stage and necessary for driving the stage, or a signal equivalent thereto, and the controlling step of controlling the actuator which supports and drives the anti-vibration table utilizing a fluid in accordance with the generated signal.

According to the second aspect of the present invention, the inclination of the anti-vibration table which occurs when the stage is driven is corrected effectively.

The third aspect of the present invention relates to an exposure apparatus having an original stage on which an original is to be placed, and a substrate stage on which a substrate where a pattern of the original is to be transferred is placed. At least one of the original stage and the substrate stage comprises an anti-vibration table on which the stage is mounted, an actuator which supports and drives the anti-vibration table utilizing a fluid, a compensator which generates a signal by PI- or PID-compensating a target value signal concerning the stage and necessary for driving the stage, or a signal equivalent thereto, and a controller which controls the actuator in accordance with an output signal from the compensator.

According to the third aspect of the present invention, the inclination of the anti-vibration table which occurs when the stage is driven is corrected effectively, so a high productivity can be achieved.

The fourth aspect of the present invention relates to a device manufacturing method including the coating step of coating a substrate with a photosensitive material, the exposure step of transferring by an exposure apparatus a pattern of an original to the substrate coated with the photosensitive material, and the developing step of developing the substrate to which the pattern has been transferred. The exposure apparatus has an original stage on which the original is to be placed, and a substrate stage on which the substrate coated with the photosensitive material is to be placed. At least one of the original stage and the substrate stage comprises an anti-vibration table on which the stage is mounted, an actuator which supports and drives the anti-vibration table utilizing a fluid, a compensator which generates a signal by PI- or PID-compensating a target value signal concerning the stage and necessary for driving the stage, or a signal equivalent thereto, and a controller which controls the actuator in accordance with an output signal from the compensator.

According to the fourth aspect of the present invention, the inclination of the anti-vibration table which occurs when the stage is driven is corrected effectively, so a high productivity can be achieved.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 3A and 3B are graphs showing the inclination of a main body structure in a one-shot scanning movement, in which FIG. 3A shows a signal indicating the inclination of an anti-vibration table when conventional moving load correction is performed, and FIG. 3B shows a signal indicating the inclination of the anti-vibration table when moving load correction according to the present invention is performed;

FIGS. 4A and 4B are graphs showing the inclination of the main body structure in a continuous scanning movement, in which FIG. 4A shows an error signal indicating the inclination of the anti-vibration table when conventional moving load correction is performed, and FIG. 4B shows an error signal indicating the inclination of the anti-vibration table when moving load correction according to the present invention is performed;

DETAILED DESCRIPTION OF THE PREFERRED EMBODIMENTS

Figure 1:
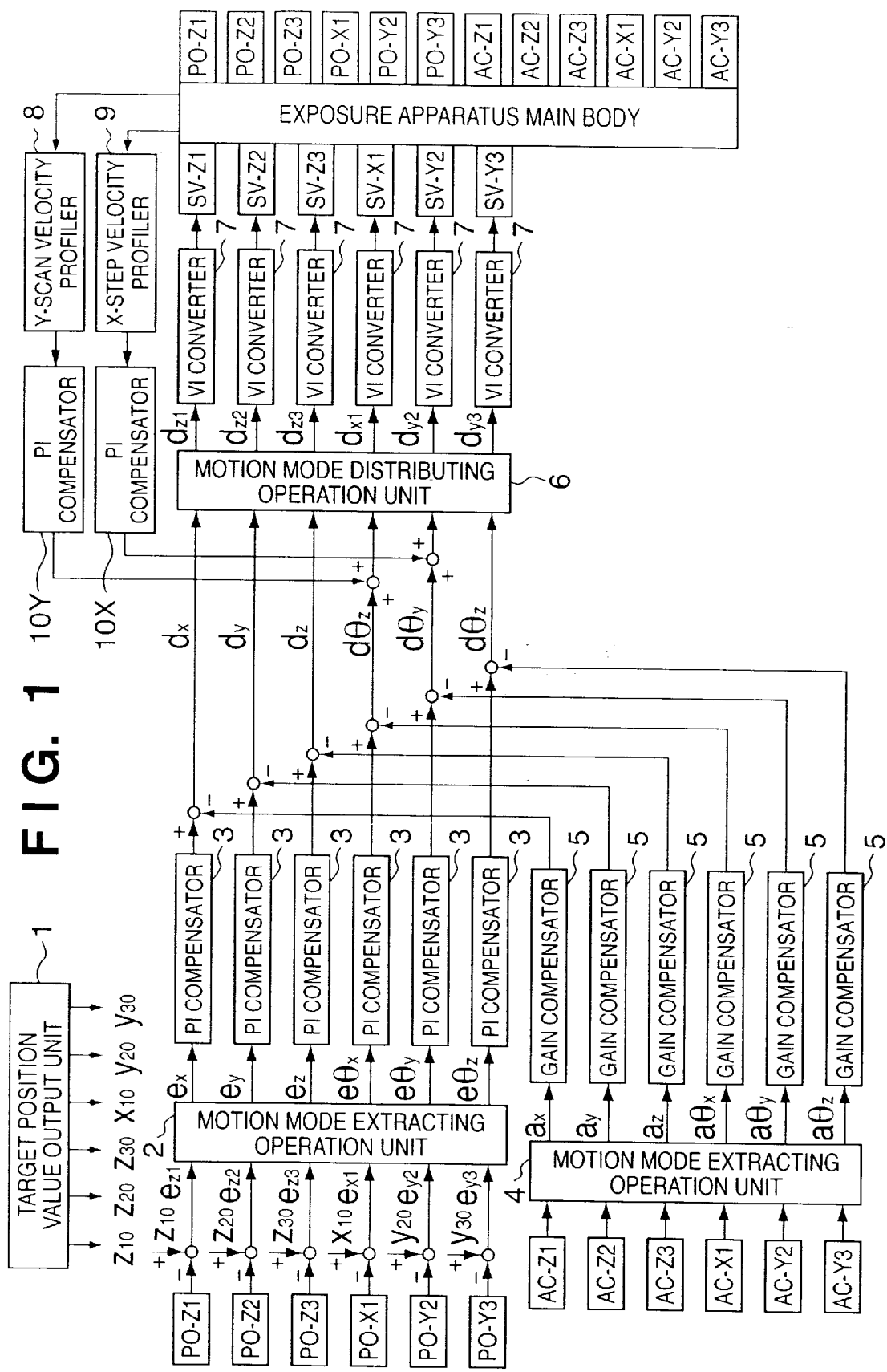
FIG. 1 is a view showing an active anti-vibration apparatus according to the first embodiment of the present invention.
Figure 2:
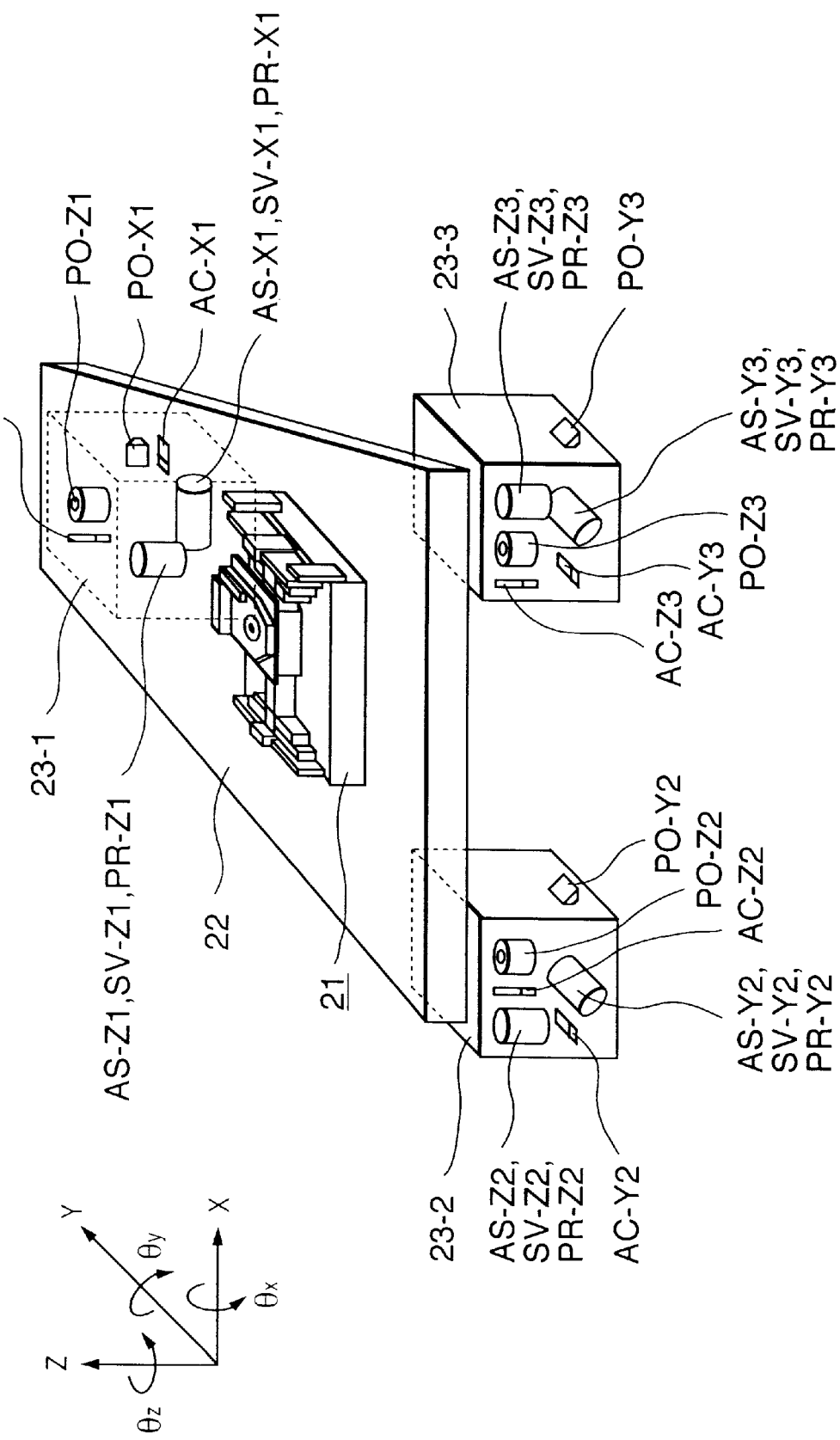
FIG. 2 is a perspective view showing an example of the mechanical arrangement of the active anti-vibration apparatus.
Figure 7:
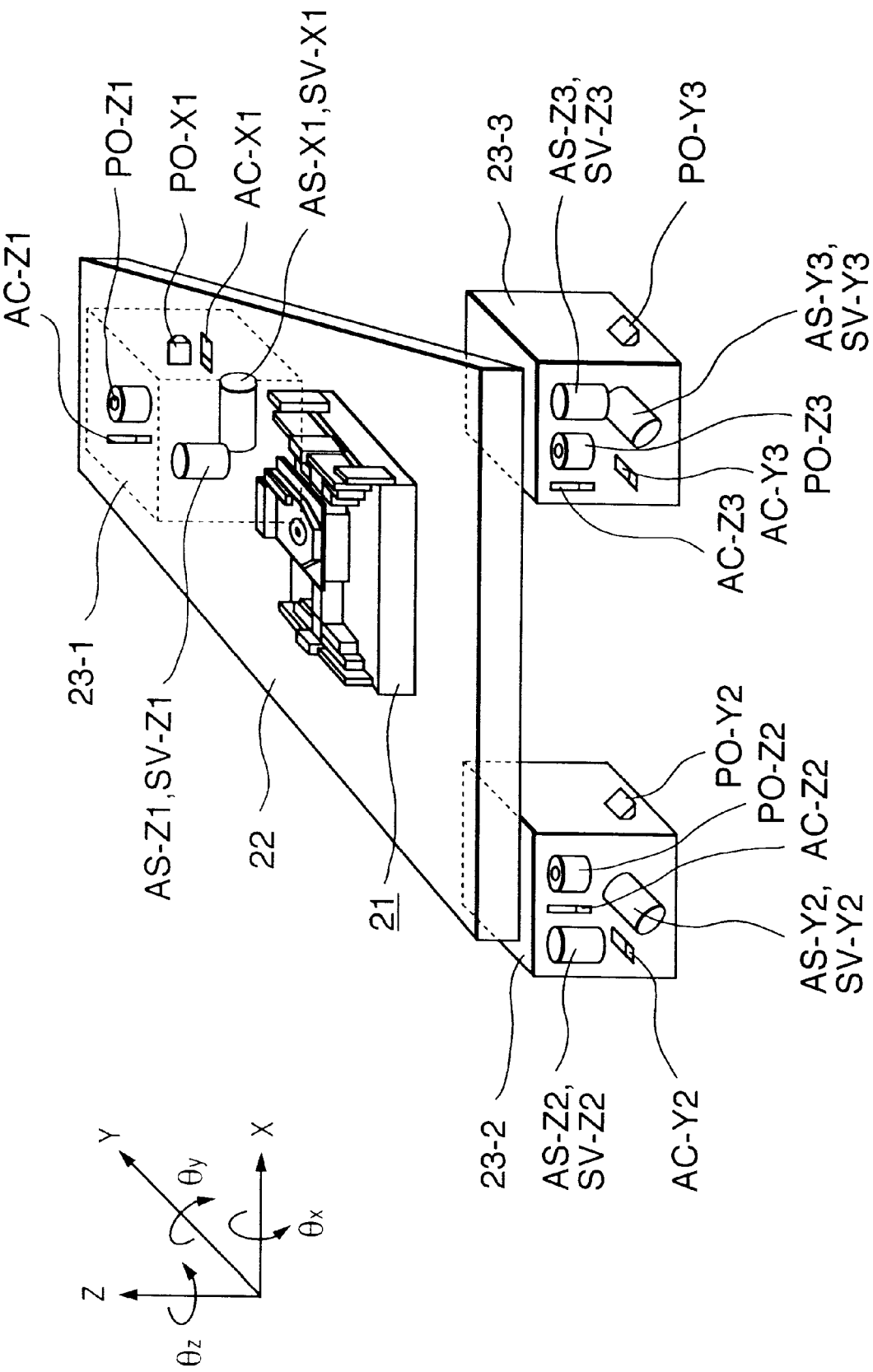
FIG. 7 is a perspective view showing another example of the mechanical arrangement of the active anti-vibration apparatus.

The embodiments of the present invention will be described with reference to the accompanying drawings.
[First Embodiment]
FIG. 1 is a block diagram of the control system of an active anti-vibration apparatus according to an embodiment of the present invention. FIGS. 2 and 7 are views showing two mechanical arrangements of the active anti-vibration apparatus shown in FIG. 1, in which FIG. 2 shows an active anti-vibration apparatus including a pressure sensor, and FIG. 7 shows an anti-vibration apparatus not including a pressure sensor. Referring to FIGS. 1, 2, and 7, outputs from position sensors PO-Z1, PO-Z2, PO-Z3, PO-X1, PO-Y2, and PO-Y3 are respectively compared with ($Z_{10}$, $Z_{20}$, $Z_{30}$, $X_{10}$, $Y_{20}$, and $Y_{30}$) as outputs from a target position value output unit 1 to generate position error signals ($e_{z1}$, $e_{z2}$, $e_{z3}$, $e_{x1}$, $e_{y2}$, and $e_{y3}$) respective axes. These error signals are guided to a motion mode extracting operation unit 2 concerning a position signal and for calculating and outputting motion mode position error signals ($e_x$, $e_y$, $e_z$, $e\theta_x$, $e\theta_y$, and $e\theta_z$) of a total of six degrees of freedom for translation and rotation about the respective axes of an anti-vibration table 22. The output signals ($e_x$, $e_y$, $e_z$, $e\theta_x$, $e\theta_y$, and $e\theta_z$) from the motion mode extracting operation unit 2 are guided to PI compensators 3 concerning a position and not substantially interfering with each other among the motion modes and for adjusting position characteristics. P indicates proportional operation while I indicates integral operation. This loop is referred to as a position feedback loop.

Outputs from acceleration sensors AC-Z1, AC-Z2, AC-Z3, AC-X1, AC-Y2, and AC-Y3 serving as vibration measuring sensors are subjected to an appropriate filtering process, e.g., removal of high-frequency noise, and are immediately provided to a motion mode extracting operation unit 4 concerning acceleration. The motion mode extracting operation unit 4 outputs motion mode acceleration signals ($a_x$, $a_y$, $a_z$, $a\theta_x$, $a\theta_y$, and $a\theta_z$). The motion mode acceleration signals ($a_x$, $a_y$, $a_z$, $a\theta_x$, $a\theta_y$, and $a\theta_z$) are provided to gain compensators 5 concerning the acceleration signal in order to set optimal damping in units of motion modes. By adjusting the gains of the gain compensators 5, optimal damping characteristics can be obtained in units of motion modes. This loop is referred to as an acceleration feedback loop.

Outputs from the PI compensators 3 concerning the position and negative feedback signals as outputs from the gain compensators 5 concerning the acceleration are added to generate drive signals ($d_x$, $d_y$, $d_z$, $d\theta_x$, $d\theta_y$, and $d\theta_z$) in units of motion modes. Successively, the drive signals in units of motion modes are provided to a motion mode distributing operation unit 6 (controller) which generates signals ($d_{z1}$, $d_{z2}$, $d_{z3}$, $d_{x1}$, $d_{y2}$, and $d_{y3}$) for driving servo valves SV-Z1, SV-Z2, SV-Z3, SV-X1, SV-Y2, and SV-Y3 of pneumatic spring actuators AS-Z1, AS-Z2, AS-Z3, AS-X1, AS-Y2, and AS-Y3 of the respective axes. Outputs ($d_{z1}$, $d_{z2}$, $d_{z3}$, $d_{x1}$, $d_{y2}$, and $d_{y3}$) from the motion mode distributing operation unit 6 excite voltage-to-current converters (VI converters) 7 which control the opening/closing operation of the servo valves SV-Z1, SV-Z2, SV-Z3, SV-X1, SV-Y2, and SV-Y3 for connecting/disconnecting air as the operating fluid of the pneumatic spring actuators AS-Z1, AS-Z2, AS-Z3, AS-X1, AS-Y2, and AS-Y3. Thus, the anti-vibration table 22 is driven in units of motion modes, so that the inclination of the anti-vibration table 22 which occurs when a wafer stage 21 mounted on the anti-vibration table 22 is driven is corrected. The pneumatic spring actuators AS-Z1, AS-Z2, AS-Z3, AS-X1, AS-Y2, and AS-Y3 are actuators for supporting and driving the anti-vibration table 22 by utilizing pneumatic pressure. The present invention can employ not only pneumatic actuators but also any actuator that utilizes an appropriate fluid.

In the active anti-vibration apparatus described above, the wafer stage 21 (FIGS. 2 and 7) for accelerating/decelerating sharply is mounted on the main body structure supported by three active support legs 23-1, 23-2, and 23-3. When the wafer stage 21 is driven, the center of gravity of the main body structure including the anti-vibration table 22 (FIGS. 2 and 7) changes to incline the main body structure. In order to correct this inclination, in this embodiment, a Y-scan velocity profiler 8 and X-step velocity profiler 9 generate velocity profiles for controlling the driving operation of the wafer stage 21. Note that the wafer stage 21 is scan-driven in the Y direction and step-driven in the X direction.

Figures 5A, 5B, 5C:
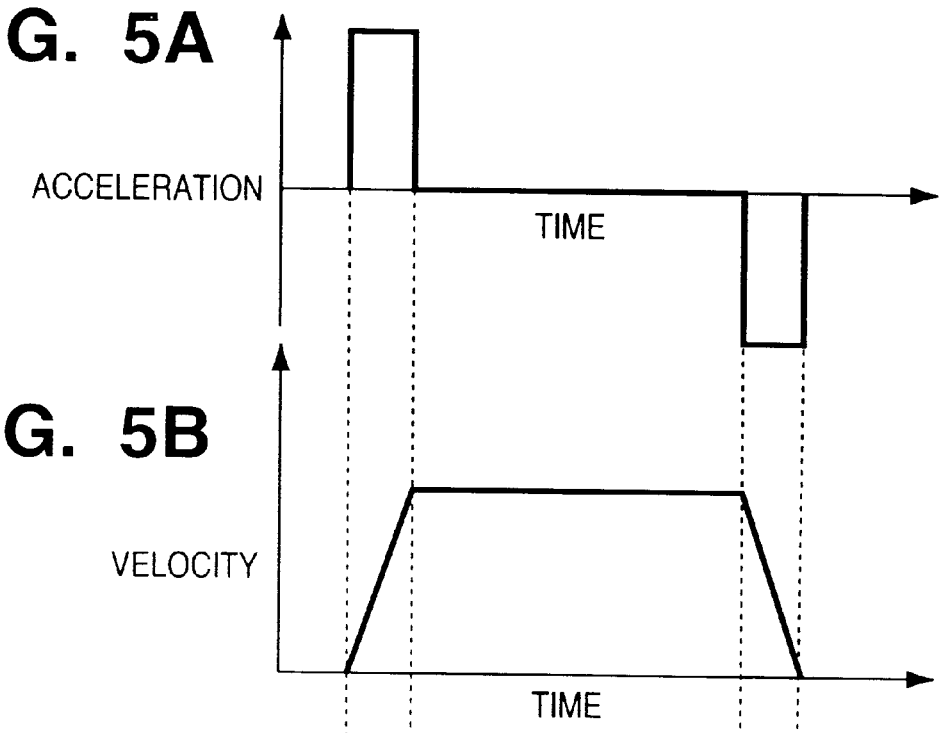
FIGS. 5A to 5C are graphs showing examples of acceleration, velocity, and position profiles.

FIGS. 5A, 5B, and 5C are graphs showing examples of the acceleration, velocity, and position profiles, respectively. For example, the velocity profile has a trapezoidal shape as shown in FIG. 5B. The Y-scan velocity profiler 8 and X-step velocity profiler 9 provide target velocity signals to PI compensators 10X and 10Y, concerning moving load correction, in accordance with the generated velocity profiles. In other words, the target velocity signals output from the Y-scan velocity profiler 8 and X-step velocity profiler 9 are feed-forwarded to portions where the motion mode drive signal flows through the PI compensators 10X and 10Y.

More specifically, when the wafer stage 21 is scan-driven in the Y direction, the main body structure including the anti-vibration table 22 rotates about the X-axis and is thus inclined. Thus, the velocity profile necessary when scan-driving the wafer stage 21 in the Y direction is generated by the Y-scan velocity profiler 8, and a target velocity signal determined by this velocity profile is added to the motion mode drive signal $d\theta_x$ through the PI compensator 10Y concerning moving load correction. When the wafer stage 21 (FIGS. 2 and 7) is step-driven in the X direction, the main body structure including the anti-vibration table 22 (FIGS. 2 and 7) rotates about the Y-axis and is thus inclined. Thus, the velocity profile necessary when step-driving the wafer stage 21 in the X direction is generated by the X-step velocity profiler 9, and a target velocity signal determined by this velocity profile is added to the motion mode drive signal $d\theta_y$ through the PI compensator 10X concerning moving load correction.

In the prior art (Japanese Patent Laid-Open No. 11-264444 and the like), the velocity profile is added to the motion mode drive signal concerning the motion mode, the inclination of which is to be corrected, through the P compensator, i.e., by multiplying the output from the velocity profiler by an appropriate gain. In contrast to this, this embodiment is characterized in that PI compensators are used in place of the P compensator. When the P compensator is altered to the PI compensators, the effect of moving load correction can be increased remarkably.

FIGS. 3A and 3B show the inclination of the main body structure in one-shot scan operation as an experimental result which clarifies the effect of this embodiment through comparison. FIG. 3A shows a signal indicating the inclination of the anti-vibration table and obtained when the velocity profile of the stage is multiplied by an appropriate gain and feed-forward input to an active anti-vibration apparatus using a pneumatic spring as the actuator (prior art).

Although not shown, when compared to a case wherein this feed-forward is not applied, in the case shown in FIG. 3A, the inclination of the anti-vibration table is largely suppressed. However, low-frequency fluctuation still exists. In other words, although the inclination of the main body structure including the anti-vibration table 22 (FIGS. 2 and 7) is almost suppressed by application of the feed-forward signal, it is not corrected sufficiently. In this embodiment, the velocity profile obtained when the wafer stage 21 (FIGS. 2 and 7) is scanned in the Y direction is feed-forwarded through the PI compensator 10Y. FIG. 3B shows the result of this embodiment. In FIG. 3B, low-frequency fluctuation is not observed in the inclination of the anti-vibrating table during a uniform motion period, excluding an acceleration/deceleration period, of the stage. In other words, the inclination (rotation about the X-axis) of the main body structure including the anti-vibration table 22 is corrected substantially completely.

Figure 4B:
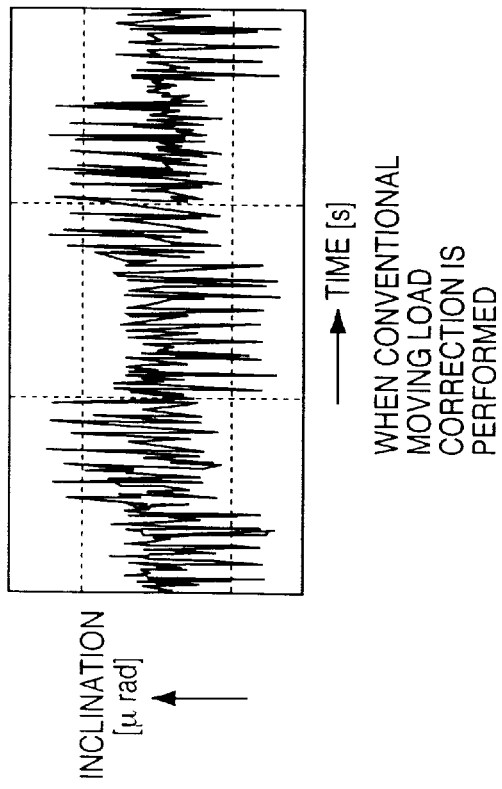
Figure 4A:
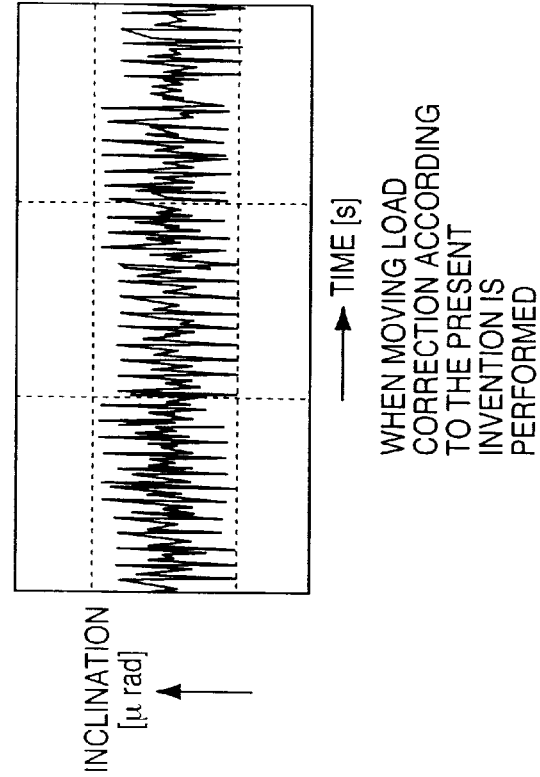

FIGS. 4A and 4B show the inclination (rotation about the X-axis) of the main body structure, including the anti-vibration table 22 (FIGS. 2 and 7), which is obtained when the wafer stage 21 (FIGS. 2 and 7) is scanned continuously with conventional moving load correction being performed and with moving load correction according to this embodiment being performed.

[Second Embodiment]

The second embodiment provides a modification of the first embodiment. In the following description, only the differences from the first embodiment will be described, and a description will follow the first embodiment unless otherwise specified.

In the first embodiment, the target velocity signal determined by the velocity profile for driving the wafer stage 21 is feed-forwarded to the motion mode distributing operation unit 6 through the PI compensators 10X and 10Y concerning moving load correction, thereby driving the pneumatic spring actuator. An effect equivalent to this feed-forward can be obtained by another means as follows.

More specifically, a feed-forward signal for the motion mode distributing operation unit 6 can be generated on the basis of not only the velocity profile but also the position profile. In this case, for example, a target velocity signal and target position signal determined by a velocity profile and position profile for driving a wafer stage 21 (FIGS. 2 and 7) are multiplied by appropriate gains and are added. The sum signal is feed-forwarded to a motion mode distributing operation unit 6, thereby driving the pneumatic spring actuator. In this case, the effect of FIGS. 3A and 3B and 4A and 4B based on the first embodiment can be similarly obtained. This arrangement is equivalent to that of the first embodiment, and can generate a feed-forward signal equivalent to the feed-forward signal of the first embodiment.

To perform more precise moving load correction, the PI compensators 10X and 10Y used in the first embodiment and concerning moving load correction can be altered to PID compensators. Note that P means proportional operation, I means integral operation, and D means derivative operation.

Alternatively, the following measure may be employed in place of providing PID compensators.

More specifically, a target velocity signal, target position signal, and target acceleration signal determined by the velocity, position, and acceleration profiles of the wafer stage 21 are output through appropriate P compensators. The output signals are added and a resultant sum signal is feed-forwarded to a motion mode distributing operation unit 6, thereby driving the pneumatic spring actuator.

Figure 6:
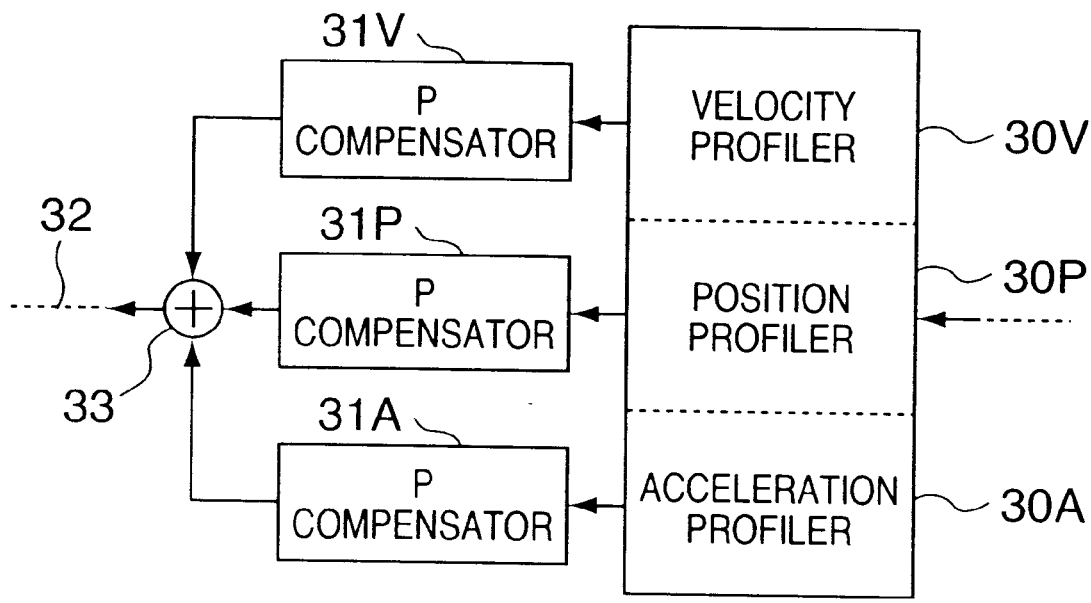
FIG. 6 is a view showing a feed-forward arrangement for moving load correction according to the second embodiment of the present invention.

FIG. 6 is a view showing a feed-forward arrangement for moving load correction of this embodiment. The arrangement comprised of the PI compensator 10X and X-step velocity profiler 9 shown in FIG. 1 and the arrangement comprised of the PI compensator 10Y and Y-scan velocity profiler 8 shown in FIG. 1 can be each replaced by the arrangement shown in FIG. 6.

Referring to FIG. 6, the profiler includes a velocity profiler 30V, position profiler 30P, and acceleration profiler 30A. For example, the respective profilers 30A, 30P, and 30A output profiles as shown in FIGS. 5B, 5C, and 5A. A target velocity signal, target position signal, and target acceleration signal determined by the velocity, position, and acceleration profilers 30V, 30P, and 30A are supplied to P compensators 31V, 31P, and 31A, respectively, and are then respectively multiplied by appropriate gains. Outputs from the P compensators 31V, 31P, and 31A are added by an adder 33 to generate a feed-forward signal 32 to be supplied to a motion mode distributing operation unit 6. In FIG. 1, the feed-forward signal 32 is added to the drive signal $d\theta_x$ or $d\theta_y$ in units of motion modes. In other words, the arrangement shown in FIG. 6 is equivalent to the PID compensator for the velocity profile and can generate a feed-forward signal equivalent to that of the PID compensator.

[Supplementation on First and Second Embodiments]

According to the first embodiment, in FIG. 1, the target velocity signal determined by the velocity profile of the stage serving as a moving load is used as a signal for feed-forward. The target velocity signal is feed-forwarded to the motion mode distributing operation unit 6, serving as a preceding stage of the VI converters 7 for driving the pneumatic spring actuator, through the PI compensators 10X and 10Y.

Assume that noise or the like is mixed in the target velocity signal to be supplied to the PI compensators 10X and 10Y. Then, the noise is integrated to generate an excessively large feed-forward signal, which may consequently incline the main body structure including the anti-vibration table 22 (FIGS. 2 and 7) undesirably. More specifically, when a signal is extracted from a closed loop for controlling the wafer stage 21 and is used as a feed-forward signal for moving load correction, a steady noise component or residual offset signal is integrated by the PI compensators 10X and 10Y to generate an unwanted signal as a signal for moving load correction.

In the first embodiment shown in FIG. 1, however, the target velocity signal determined by the velocity profile for driving the wafer stage 21 (FIGS. 2 and 7) is supplied to the PI compensators 10X and 10Y, as described above. More specifically, in the first embodiment, the feed-forward signal is generated on the basis of the target velocity signal determined by a target velocity profile necessary for driving the wafer stage 21. Therefore, noise and steady offset signals will not be integrated, and no malfunction occurs in moving load correction, which are excellent characteristic features. These characteristic features also apply to the second embodiment.

[Third Embodiment]

In the first and second embodiments, the stage mounted on the active anti-vibration apparatus is the wafer stage 21 (FIGS. 2 and 7) for placing a semiconductor wafer. The present invention can also be applied to a case wherein a structure including a reticle stage where a reticle drawn with a circuit pattern is to be placed is supported by an active anti-vibration apparatus.

The third embodiment relates to an exposure apparatus having a reticle stage where an original is to be placed, the first active anti-vibration apparatus for supporting the reticle stage, a wafer stage where a wafer is to be placed, and the second anti-vibration apparatus for supporting the wafer stage. When the first embodiment is applied to this exposure apparatus, a target velocity signal determined by a velocity profile for driving the reticle stage is feed-forwarded to the motion mode distributing operation unit of the first active anti-vibration apparatus through the first PI compensator, and/or a target velocity signal determined by a velocity profile for driving the wafer stage is feed-forwarded to the motion mode distributing operation unit of the second active anti-vibration apparatus through the second PI compensator. When the second embodiment is applied to this exposure apparatus, a target velocity signal, target position signal, and target acceleration signal determined by a velocity profile, position profile, and acceleration profile for driving the reticle stage are feed-forwarded to the motion mode distributing operation unit of the first active anti-vibration apparatus through the first PID compensators (31V, 31P, and 31A), and/or a target velocity signal, target position signal, and target acceleration signal determined by a velocity profile, position profile, and acceleration profile for driving the wafer stage are feed-forwarded to the motion mode distributing operation unit of the second active anti-vibration apparatus through the first PID compensators (31V, 31P, and 31A).

[Embodiment of Device Production Method]

An embodiment of a device manufacturing method utilizing the exposure apparatus described above will be described.

Figure 8:
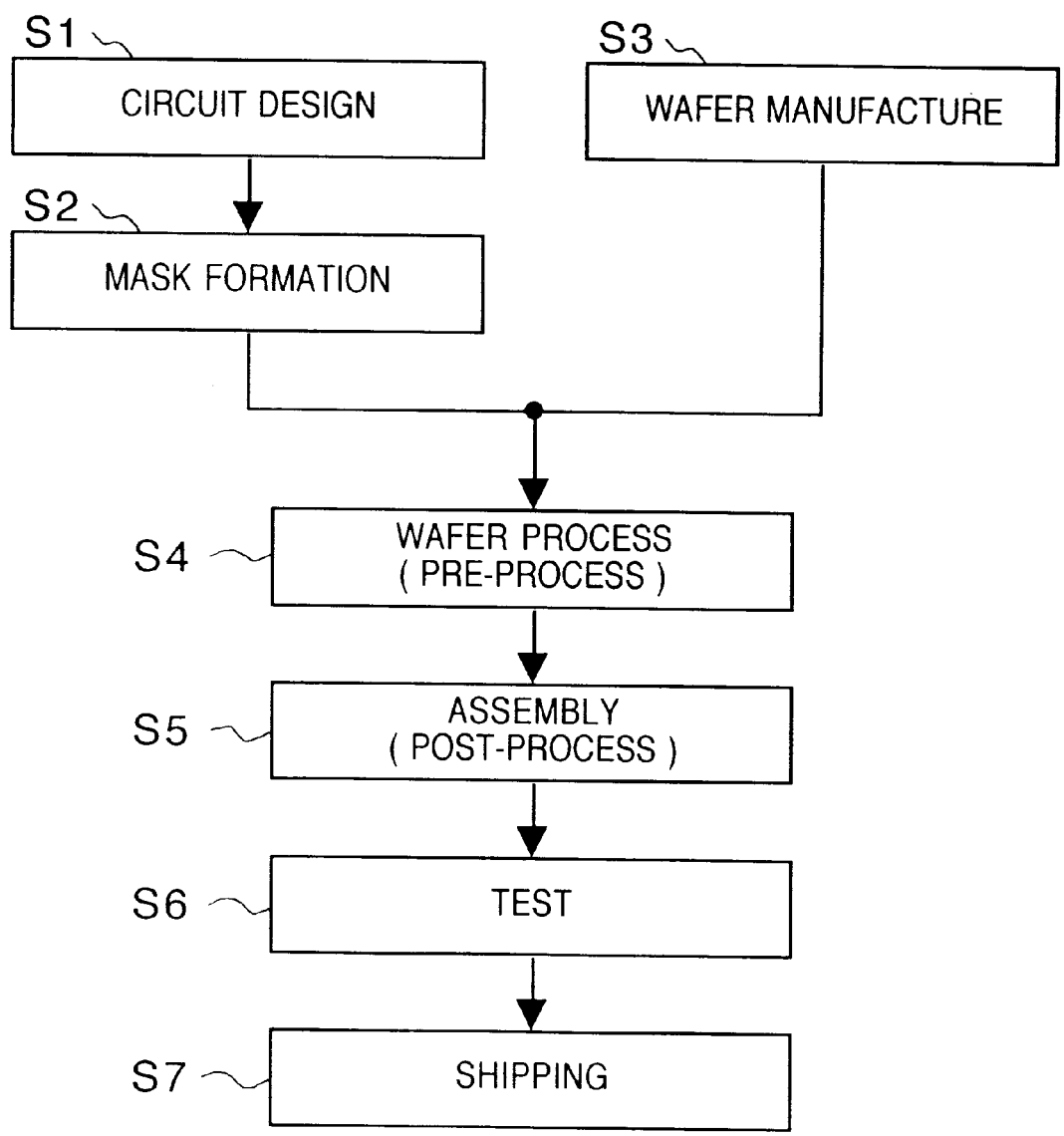
FIG. 8 is a flow chart showing the flow of the manufacture of a microdevice.

FIG. 8 is a flow chart showing the manufacture of a microdevice (a semiconductor chip such as an IC or LSI, a liquid crystal panel, a CCD, a thin film magnetic head, a micromachine, and the like). In step 1 (circuit design), the pattern of the device is designed. In step 2 (mask formation), a mask on which the designed pattern is formed is formed. In step 3 (wafer manufacture), a wafer is manufactured by using a material such as silicon or glass. In step 4 (wafer process), which is referred to as a pre-process, the prepared mask and wafer are fixed at predetermined positions of the exposure apparatus, and an actual circuit is formed on the wafer using a lithography technique. In step 5 (assembly), which is referred to as a post-process, a semiconductor chip is formed by using the wafer manufactured in step 4. This process includes steps such as the assembly step (dicing and bonding) and the packaging step (chip encapsulation). In step 6 (test), tests such as an operation test and durability test are performed with respect to the semiconductor device manufactured in step 5. The semiconductor device is completed through these steps and shipped (step 7).

Figure 9:
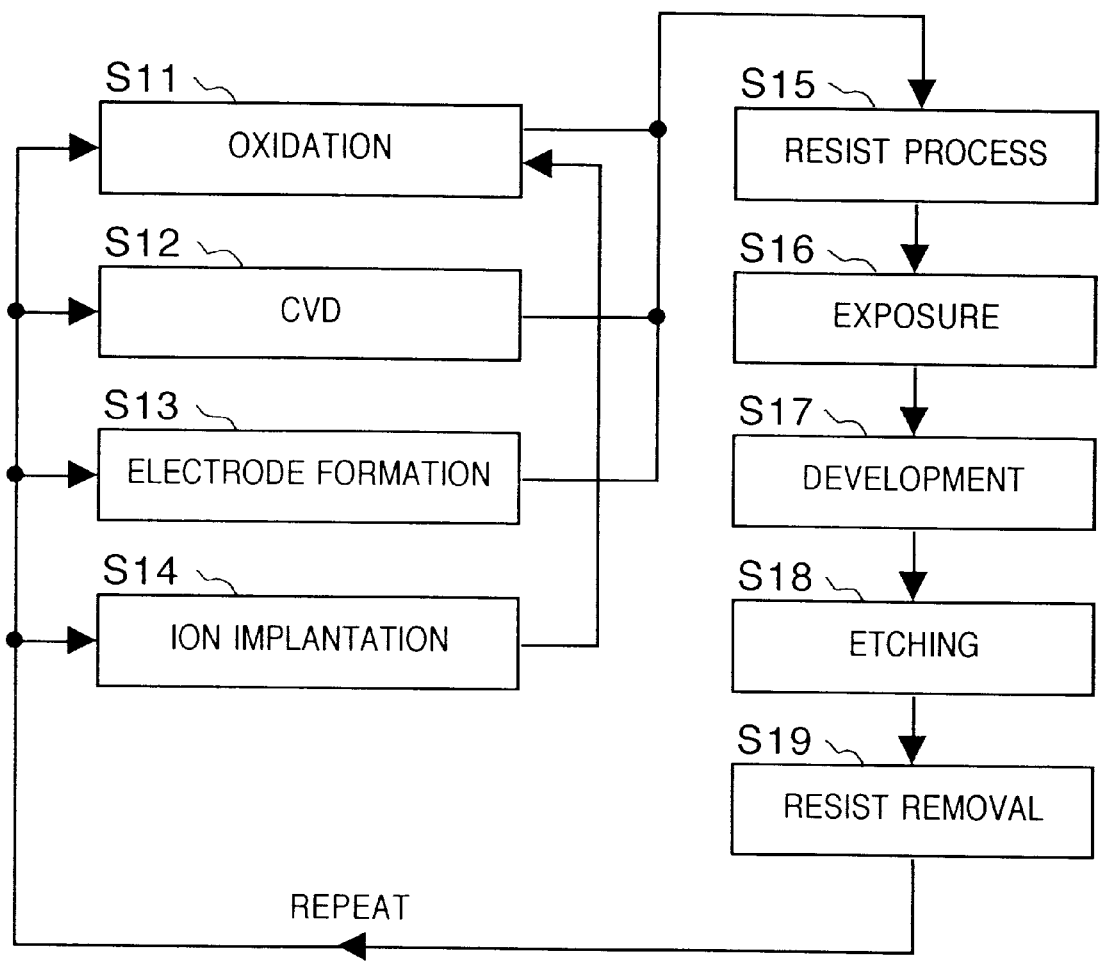
FIG. 9 is a flow chart showing the detailed flow of the wafer process in FIG. 7.

FIG. 9 is a flow chart showing the above wafer process in detail. In step 11 (oxidation), the upper surface of a wafer is oxidized. In step 12 (CVD), an insulating film is formed on the upper surface of the wafer. In step 13 (electrode formation), an electrode is formed on the wafer by vapor deposition. In step 14 (ion implantation), ions are implanted into the wafer. In step 15 (resist process), the wafer is coated with a photosensitive agent. In step 16 (exposure), the circuit pattern on the mask is printed/exposed on the wafer by the above exposure apparatus. In step 17 (development), the exposed wafer is developed. In step 18 (etching), portions other than the developed resist image are removed. In step 19 (resist removal), the unnecessary resist after etching is removed. By repeating these steps, multiple circuit patterns can be formed on the wafer.

A high-integration device, which is difficult to manufacture in the prior art, can be manufactured by using the manufacturing method of this embodiment.

The preferred embodiments of the present invention have the following effects.

(1) The inclination of the main body structure caused by a change in center of gravity upon high-speed movement of the stage can be suppressed or decreased more than in the prior art.

(2) Conventionally, the internal pressure of the pneumatic spring actuator is increased or decreased in accordance with the moving distance of the stage with the premise of pressure feedback application that the internal pressure of the pneumatic spring actuator is measured and fed back (or including detection and feedback of a load). In contrast to this, according to the present invention, effective moving load correction can be performed even in an active anti-vibration apparatus (FIG. 7) in which pressure feedback is not applied. Therefore, pressure gauges (PR-xx) are not required, and accordingly no pressure gauges need be purchased, built in active support legs, or electrically packaged. As a result, a large cost reduction becomes possible.

(3) Despite high-speed, continuous movement of the stage, the inclination of the main body structure is corrected and decreased to substantially zero. Therefore, a disturbance resulting from inclination of the main body structure is not applied to the stage. In other words, stable positioning and scanning performance can be realized regardless of the moving position of the stage. More specifically, the positioning time can be shortened without adjusting the position of the stage but by only applying moving load correction of the present invention.

(4) The productivity of the exposure apparatus can be improved by the above effects.

As many apparently widely different embodiments of the present invention can be made without departing from the spirit and scope thereof, it is to be understood that the invention is not limited to the specific embodiments thereof except as defined in the claims.

What is claimed is:

1. An active anti-vibration apparatus comprising:
   an anti-vibration table on which a stage is mounted;
   an actuator which drives said anti-vibration table utilizing a fluid;
   a compensator which PI-compensates or PID-compensates a target velocity signal for driving said stage: and
   a controller which controls said actuator based on an output signal from said compensator.

2. The apparatus according to claim 1, wherein said compensator includes
   a first P compensator which P-compensates a target velocity signal for driving said stage:
   a second P compensator which P-compensates a target position signal for driving said stage: and
   an adder which adds output signals from said first and second P compensators.

3. The apparatus according to claim 1, wherein said compensator includes
   a first P compensator which P-compensates a target velocity signal for driving said stage:
   a second P compensator which P-compensates a target position signal for driving said stage:
   a third P compensator which P-compensates a target acceleration signal for driving said stage: and
   an adder which adds output signals from said first, second, and third P compensators.

4. The apparatus according to claim 1, wherein said actuator includes a pneumatic spring actuator.

5. The apparatus according to claim 1, wherein said controller controls said actuator such that inclination of said anti-vibration table which occurs when said stage is driven is corrected.

6. A method of correcting inclination of an anti-vibration table on which a stage is mounted, using an actuator which drives said anti-vibration table utilizing a fluid, the method comprising steps of:
   PI-compensating or PID-compensating a target velocity signal for driving said stage: and controlling said actuator based on the compensated signal.

7. The method according to claim 6, wherein said compensating step includes steps of:

P-compensating a target velocity signal for driving said stage:

P-compensating a target position signal for driving said stage; and adding the compensated target velocity signal and the compensated target position signal.

8. The method according to claim 6, wherein said compensating step includes steps of:

P-compensation a target velocity signal for driving said stage;

P-compensating a target position signal for driving said stage;

P-compensating a target acceleration signal for driving said stage; and adding the compensated target velocity signal, the compensated target position signal and the compensated target acceleration signal.

9. The method according to claim 6, wherein said actuator includes a pneumatic spring actuator.

10. The method according to claim 6, wherein said controlling step includes controlling said actuator such that inclination of said anti-vibration table which occurs when said stage is driven is corrected.

11. An exposure apparatus having an original stage on which an original is to be placed, and a substrate stage on which a substrate where a pattern of the original is to be transferred is placed, at least one of said stages being mounted on an active anti-vibration unit, said unit comprising:

an anti-vibration table on which one of said stages is mounted;

an actuator which drives said anti-vibration table utilizing a fluid;

a compensator which PI-compensates or PID-compensates a target velocity signal for driving said one of said stages: and a controller which controls said actuator based on an output signal from said compensator.

12. A device manufacturing method comprising steps of:

providing an exposure apparatus having an original stage on which an original is to be placed, and a substrate stage on which a substrate where a pattern of the original is to be transferred is placed, at least one of the stages being mounted on an active anti-vibration unit, said unit including an anti-vibration table on which one of the stages is mounted, an actuator which drives the anti-vibration table utilizing a fluid, a compensator which PI-compensates or PID-compensates a target velocity signal for driving the one of the stages and a controller which controls the actuator based on an output signal from the compensator;

coating a substrate with a photosensitive material;

transferring by the exposure apparatus a pattern of an original to the substrate coated with the photosensitive material; and developing the substrate to which the pattern has been transferred.

* * * * *

UNITED STATES PATENT AND TRADEMARK OFFICE
CERTIFICATE OF CORRECTION

PATENT NO. : 6,684,132 B2
DATED : January 27, 2004
INVENTOR(S) : Shinji Wakui et al.

It is certified that error appears in the above-identified patent and that said Letters Patent is hereby corrected as shown below:

Column 12,
Lines 34, 40, 42, 48, 50, 52 and 67, "stage:" should read -- stage; --.

Column 13,
Line 5, "stage:" should read -- stage; --.
Line 12, "P-compensation" should read -- P-compensating --.

Column 14,
Line 8, "stages:" should read -- stages; --.

Signed and Sealed this

Sixth Day of July, 2004

JON W. DUDAS
*Acting Director of the United States Patent and Trademark Office*